United States Patent [19]

Yoshio

[11] Patent Number: 4,920,569
[45] Date of Patent: Apr. 24, 1990

[54] DIGITAL AUDIO SIGNAL PLAYBACK SYSTEM DELAY

[75] Inventor: Junichi Yoshio, Saitama, Japan

[73] Assignee: Pioneer Electronic Corporation, Tokyo, Japan

[21] Appl. No.: 127,140

[22] Filed: Dec. 1, 1987

[30] Foreign Application Priority Data

Dec. 1, 1986 [JP] Japan ................................ 61-286441

[51] Int. Cl.$^5$ .......................... H03G 3/00; H04H 5/00
[52] U.S. Cl. ........................................ 381/61; 381/18; 369/87
[58] Field of Search ................... 381/61, 97, 1, 18, 19, 381/17; 358/198; 369/5, 60, 86, 87, 88, 89

[56] References Cited

U.S. PATENT DOCUMENTS

| | | | |
|---|---|---|---|
| 4,063,034 | 12/1977 | Peters | 381/17 |
| 4,275,267 | 6/1981 | Kurtin | 381/18 |
| 4,369,336 | 1/1983 | Agnello | 381/61 |
| 4,415,768 | 11/1983 | Carver | 381/1 |
| 4,581,759 | 4/1986 | Takahashi | 381/97 |
| 4,701,956 | 10/1987 | Katoh | 381/61 |

Primary Examiner—Tommy P. Chin
Attorney, Agent, or Firm—Sughrue, Mion, Zinn, Macpeak & Seas

[57] ABSTRACT

A signal processing circuit in a playback system, according to the present invention, comprises a storage device for temporarily storing a digital signal output from a digital output stage of the playback system and a controller for controlling the data stored in the storage device in such a manner that the data is sent out from the storage means with a time difference.

4 Claims, 2 Drawing Sheets

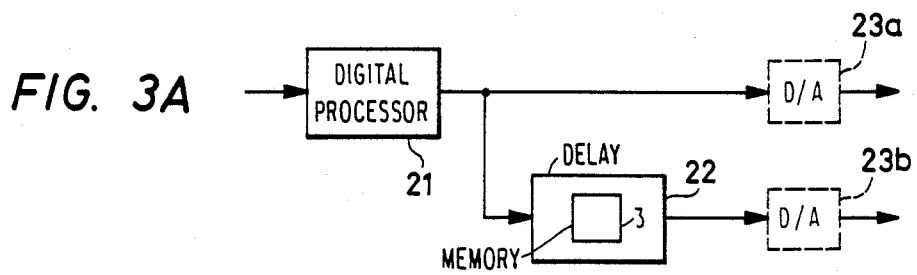
FIG. 3A
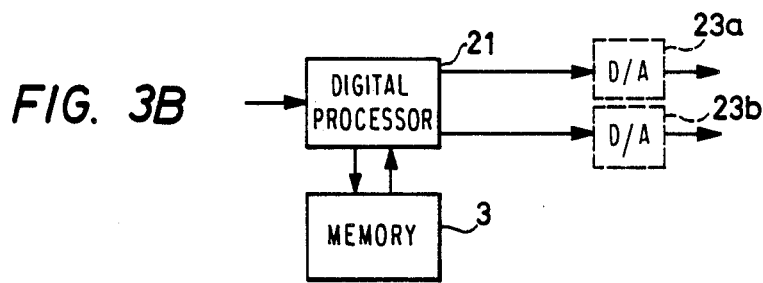
FIG. 3B
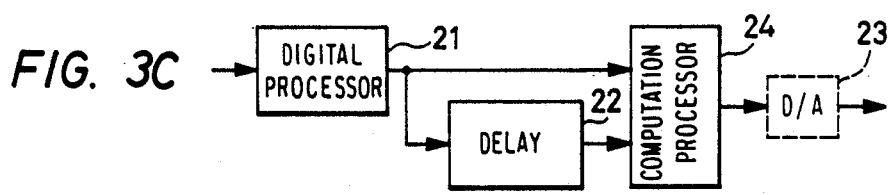
FIG. 3C
FIG. 3D
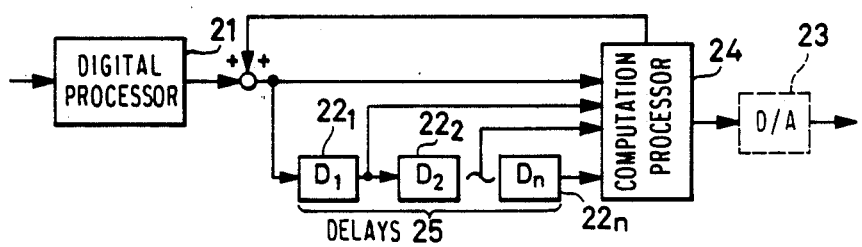

DIGITAL AUDIO SIGNAL PLAYBACK SYSTEM DELAY

BACKGROUND OF THE INVENTION

The present invention relates to a signal processing circuit and more particularly to a circuit for delaying a digital signal.

In the audio field, various systems have recently been proposed for reproducing music sounds with an affluent feeling of presence by generating a composite third sound source from conventional two-channel signals and by reproducing the third sound source at the back or lateral sides of a listener.

FIG. 1 is a block diagram of such a system for reproducing music sounds in the aforementioned manner.

A signal from a music source 10 such as a laser disk player is supplied to a main amplifier 11, and the signal is played back at front speakers $SP_1$ and $SP_2$.

The signal from the music source 10 is supplied also to a two-channel delay device 12 installed separately from the main system comprising the main amplifier 11 and the front speakers $SP_1$ and $SP_2$. The signal is delayed in the device 12 and amplified in a sub-amplifier 13 before being played back at speakers $SP_3$ and $SP_4$ disposed on lateral sides of the listener. The delay device 12, the sub-amplifier 13 and the speakers $SP_3$ and $SP_4$ form a sub-system.

In the above-mentioned system, however, since the delay device 12 of an analog type using a BBD (bucket brigade device) or the like is employed, the sub-system is by far inferior in tone quality to that of the main system in terms of the S/N ratio and the distortion factor. As a result, the feeling of presence is impaired.

Therefore, a system has recently been proposed to employ a digital delay device to improve tone quality to a greater extent. However, there is a problem that such a system needs not only an A/D converter, a D/A converter and a memory circuit but also an audio filter with high precision, as a result of which the cost of such a system becomes considerably high.

SUMMARY OF THE INVENTION

An object of the present invention is to solve the abovementioned technical problems, and to provide a signal processing circuit simple in configuration and capable of making available a high-quality delay signal.

In order to achieve the above object and other objects, according to the present invention, a signal processing circuit is provided to a reproduction system for reproducing and processing a digital audio signal.

The signal processing circuit of the present invention comprises storage means for temporarily storing a digital signal output from a digital output stage of the playback system, and control means for controlling the data stored in the storage means in such a manner that the data is output from the storage means with a time difference. The signal processing circuit further comprises conversion means for converting the digital signal from the storage means into an analog signal.

As the playback system, use can be made of a laser disk player, CD (Compact Disk) player or a PCM recorder equipped with a circuit for reproducing digital voice signals.

The digital signal reproduced at the playback system from a CD or the like is stored in the storage means and the data stored in the storage means is processed by the control means to delay the output of the data. Accordingly, the tone quality can be considerably improved.

Furthermore, according to the present invention, since part of a digital playback circuit for general use is employed in the signal processing circuit, the A/D converter, the filter, etc., are not required.

BRIEF DESCRIPTION OF THE DRAWING

FIGS. 3A through 3D are schematic diagrams showing examples of forms for application of the signal processing circuit of the present invention.

DETAILED DESCRIPTION OF THE PREFERRED EMBODIMENTS

Figure 1:
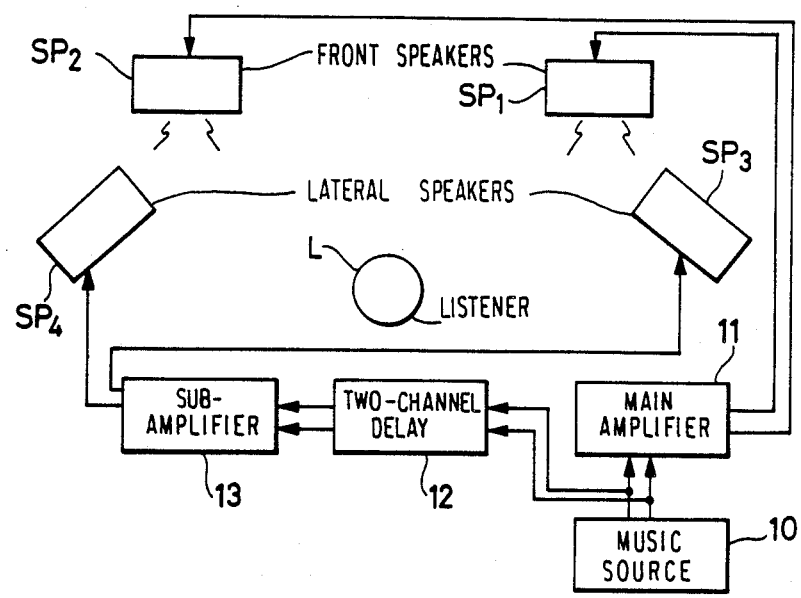
FIG. 1 shows schematically a block diagram of a conventional signal processing circuit.
Figure 2:
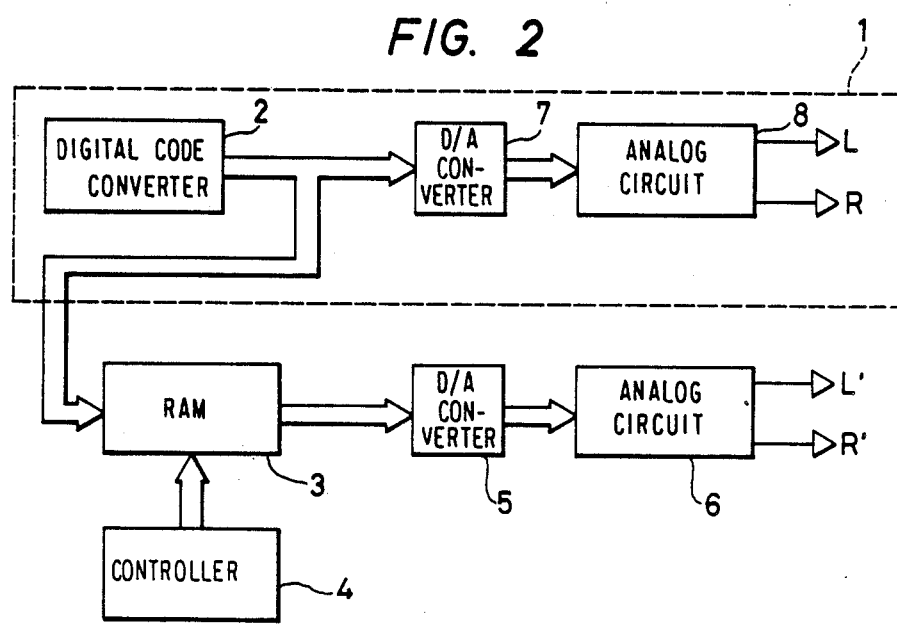
FIG. 2 is a block diagram of an embodiment of the present invention.

Referring now to FIG. 2, an embodiment of the present invention will be described in detail. A playback system 1 represents a whole circuit of a CD player for playing back and processing a digital audio signal.

The playback or reproduction system 1 comprises a digital output means 2 for converting the signal recorded on the CD into a digital code, a D/A converter 7 for converting the digital signal from the digital output means 2 into an analog form, and an analog circuit 8 for processing the analog signal from the D/A converter 7.

The playback system 1 may be used not only in a CD player but also as a reproduction circuit for reproducing a sound such as a digital voice installed in a laser disk player, a PCM recorder or the like.

A RAM (Random Access Memory) 3 as the storage means is connected to the rear stage of the digital output stage 2 so that the digital signal from the digital output means 2 is temporarily stored in the storage means 3.

Although there are various formats of the digital signal produced from the digital output stage 2, any format includes, within one period in the serial output, a pair of left and right signals with their bit clock signals, a 44.1 KHz strobe clock signal for distinguishing the left and right signals from each other and an 88.2 KHz strobe clock signal for the D/A converter 7 and the like.

Control means 4 is connected to the storage means 3 and controls the storage means 3 so that the data in the storage means 3 will be output from the storage means 3 with a time difference.

The digital signal from the storage means 3 is received by conversion means 5 connected to the rear stage of the storage means 3. The digital signal is converted in the conversion means 5 into an analog signal. The analog signal is processed in an analog circuit 6 for processing the analog signal to make a music sound.

In the conventional digital process, the sound converted into an analog form is again converted into a digital form, whereas, according to the present invention, the digital signal reproduced from the CD or the like can be directly processed, so that the tone quality is further improved.

The above-described signal processing circuit of the present invention can be applied in the forms shown in FIGS. 3A through 3D, for example.

FIG. 3A shows a basic form for application of the signal processing circuit of the present invention. The form of FIG. 3A is basically equal to the form shown in FIG. 2. The signal output from the digital processing portion 21 is sent to the digital/analog converter 23a and also to the delay portion 22 including memory portion 3. The signal delayed in the delay portion 22 is sent to the digital/analog converter 23b where the digital signal is converted into analog form.

FIG. 3B shows another basic form almost the same as the form of FIG. 3A. As in FIG. 3A, where the memory 3 is used for the delay portion, a memory inside the processing portion is used in FIG. 3C. In other words, for example, a memory such as a deinterleave memory in the decoder of the CD is used as the memory 3.

FIG. 3C shows still another form for application of the signal processing circuit of the present invention. The form of FIG. 3A is provided with calculation processing portion 24 to constitute the form of FIG. 3C. In the system of FIG. 3C, the signal output from the digital processing portion 21 and the signal from the delay portion 22 are calculated with each other in the computation processing portion 24.

FIG. 3D shows another form for application of the signal processing circuit of the present invention. In FIG. 3D, there are provided multiple stages of delay portions $22_1$ through $22_n$ to form a multiple stage of delaying portion 25. The outputs of the respective delaying stages $22_1$ through $22_n$ and the output of the digital processing portion 21 are computed with one another in the computation processing portion 24. The output of the portion 24 is fed back to the portion preceding the first delay stage portion $22_1$.

Therefore, according to the signal processing circuit of the present invention, it is possible to play back the Dolby Surround System (TM) by delaying the signals obtained by subtracting the right signals from the left signals, controlling the signals such that the frequency characteristics of the signals will suit a standardized one, and subjecting the signals to noise reduction.

The signal processing circuit of the present invention may also be applied to a well known system in which a plurality of delaying stages are provided, the output signals of the respective delaying stages are computed with one another and the result thereof is fed back to a stage preceding the delaying stages to thereby simulate reverberation. Furthermore, in the case where fluctuation is provided in delay time provided in the signal processing circuit of the present invention, a flanging effect, etc., can be obtained.

According to the present invention, since the digital signal played back from the CD or the like is directly subjected to delay processing, the tone quality can be dramatically improved as compared with what is provided by the conventional digital delay device.

Moreover, since no A/D converter nor filter is required, not only the size but also the production cost of the signal processing circuit can be considerably reduced.

As a result, the signal processing circuit of the present invention can readily be contained in the digital audio playback system and therefore the value added to the digital audio playback system is increased.

I claim:

1. A signal processing circuit in a playback system for playing back and processing a digital audio signal, said playback system including a digital output stage for producing a digital audio signal, means for converting said digital audio signal to an analog signal and means for providing said analog signal to a first sound reproduction means, said circuit comprising:

storage means for temporarily storing data corresponding to said digital audio signal output from said digital output stage of said playback system:

control means for controlling said storage means in such a manner that said data will be output from said storage means with a time difference with respect to said digital audio signal; and means for performing computation on said digital audio signal and the data output from said storage means;

wherein an output of said computation performing means is combined with said digital audio signal and the combination thereof is input to said storage means.

2. A signal processing circuit in a playback system for playing back and processing a digital audio signal, said playback system including a digital output stage for producing a digital audio signal, means for converting said digital audio signal to an analog signal and means for providing said analog signal to a first sound reproduction means, said circuit comprising:

storage means for temporarily storing data corresponding to said digital audio signal output from said digital output stage of said playback system;

control means for controlling said storage means in such a manner that said data will be output from said storage means with a time difference with respect to said digital audio signal;

conversion means for converting the data output from the storage means into an analog signal; and means for performing computation on said digital audio signal and the data output from said storage means to provide an output which is input to said conversion means;

wherein said output of said computation performing means is combined with said digital audio signal and the combination thereof is input to said storage means.

3. A signal processing circuit in a playback system for playing back and processing a digital audio signal, said playback system including a digital output stage for producing a digital audio signal, means for converting said digital audio signal to an analog signal and means for providing said analog signal to a first sound reproduction means, said circuit comprising:

storage means for temporarily storing data corresponding to said digital audio signal output from said digital output stage of said playback system;

control means for controlling said storage means in such a manner that said data will be output from said storage means with a time difference with respect to said digital audio signal; and means for performing computation on said digital audio signal and the data output from said storage means;

wherein said computation performing means generates a sound signal which includes reverberation.

4. A signal processing circuit in a playback system for playing back and processing a digital audio signal, said playback system including a digital output stage for producing a digital audio signal, means for converting said digital audio signal to an analog signal and means for providing said analog signal to a first sound reproduction means, said circuit comprising:

storage means for temporarily storing data corresponding to said digital audio signal output from said digital output stage of said playback system;

control means for controlling said storage means in such a manner that said data will be output from said storage means with a time difference with respect to said digital audio signal;

conversion means for converting the data output from the storage means into an analog signal; and means for performing computation on said digital audio signal and the data output from said storage means to provide an output which is input to said conversion means;

wherein said computation performing means generates a sound signal which includes reverberation.

* * * * *